(12) United States Patent
Tamm et al.

(10) Patent No.: US 8,525,646 B2
(45) Date of Patent: Sep. 3, 2013

(54) MINIATURE RFID TAG

(75) Inventors: Wilhelm Tamm, Althengstett (DE); Lior Shtram, Tel Aviv (IL); Peter Sartorius, Tuebingen (DE)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 12/763,919

(22) Filed: Apr. 20, 2010

(65) Prior Publication Data

US 2010/0308968 A1    Dec. 9, 2010

Related U.S. Application Data

(60) Provisional application No. 61/170,836, filed on Apr. 20, 2009.

(51) Int. Cl.
*H04Q 5/22* (2006.01)
*H01L 21/00* (2006.01)

(52) U.S. Cl.
USPC .......................................... 340/10.1; 438/106

(58) Field of Classification Search
USPC ........................................................ 340/10.1
See application file for complete search history.

(56) References Cited

U.S. PATENT DOCUMENTS

| | | | |
|---|---|---|---|
| 5,666,722 A | | 9/1997 | Tamm et al. |
| 6,011,319 A | * | 1/2000 | Kelly et al. ................. 307/10.1 |
| 6,035,527 A | | 3/2000 | Tamm |
| 7,671,295 B2 | * | 3/2010 | Sun et al. ................... 219/121.6 |
| 2004/0188531 A1 | * | 9/2004 | Gengel et al. ................ 235/491 |
| 2004/0203185 A1 | * | 10/2004 | Kerr et al. .................... 438/106 |
| 2005/0072595 A1 | * | 4/2005 | Cho .............................. 174/260 |
| 2006/0220877 A1 | * | 10/2006 | Ferguson et al. ........... 340/572.7 |
| 2008/0129459 A1 | * | 6/2008 | Bailly et al. .................. 340/10.1 |
| 2009/0045917 A1 | * | 2/2009 | Volpi et al. ................... 340/10.1 |
| 2009/0071829 A1 | * | 3/2009 | O'Banion et al. ............ 204/461 |
| 2009/0160030 A1 | * | 6/2009 | Tuttle ............................ 257/621 |

FOREIGN PATENT DOCUMENTS

| EP | 1467315 A2 | 10/2004 |
|---|---|---|
| KR | 10-2005-0032300 A | 4/2005 |

OTHER PUBLICATIONS

PCT International Search Report, International application No. PCT/US2010/031785, mailed Nov. 26, 2010, three pages.

* cited by examiner

*Primary Examiner* — Brian Zimmerman
*Assistant Examiner* — Cal Eustaquio
(74) *Attorney, Agent, or Firm* — Haverstock & Owens, LLP

(57) ABSTRACT

A technique for making an RFID tag that includes creating recesses or trenches in an insulated substrate. Conductive traces are created in the trenches so as to create an inductor coil for the RFID tag.

5 Claims, 14 Drawing Sheets

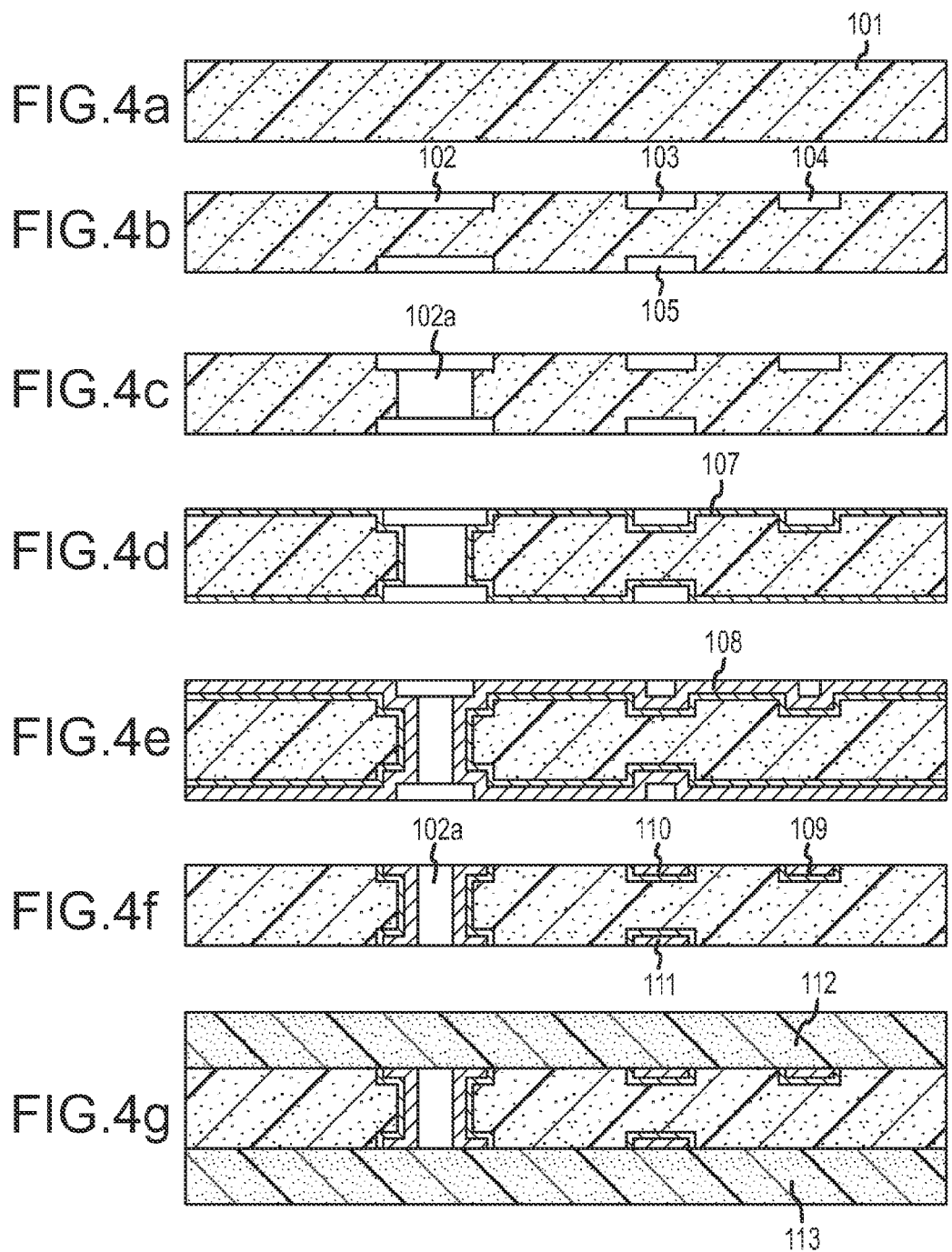

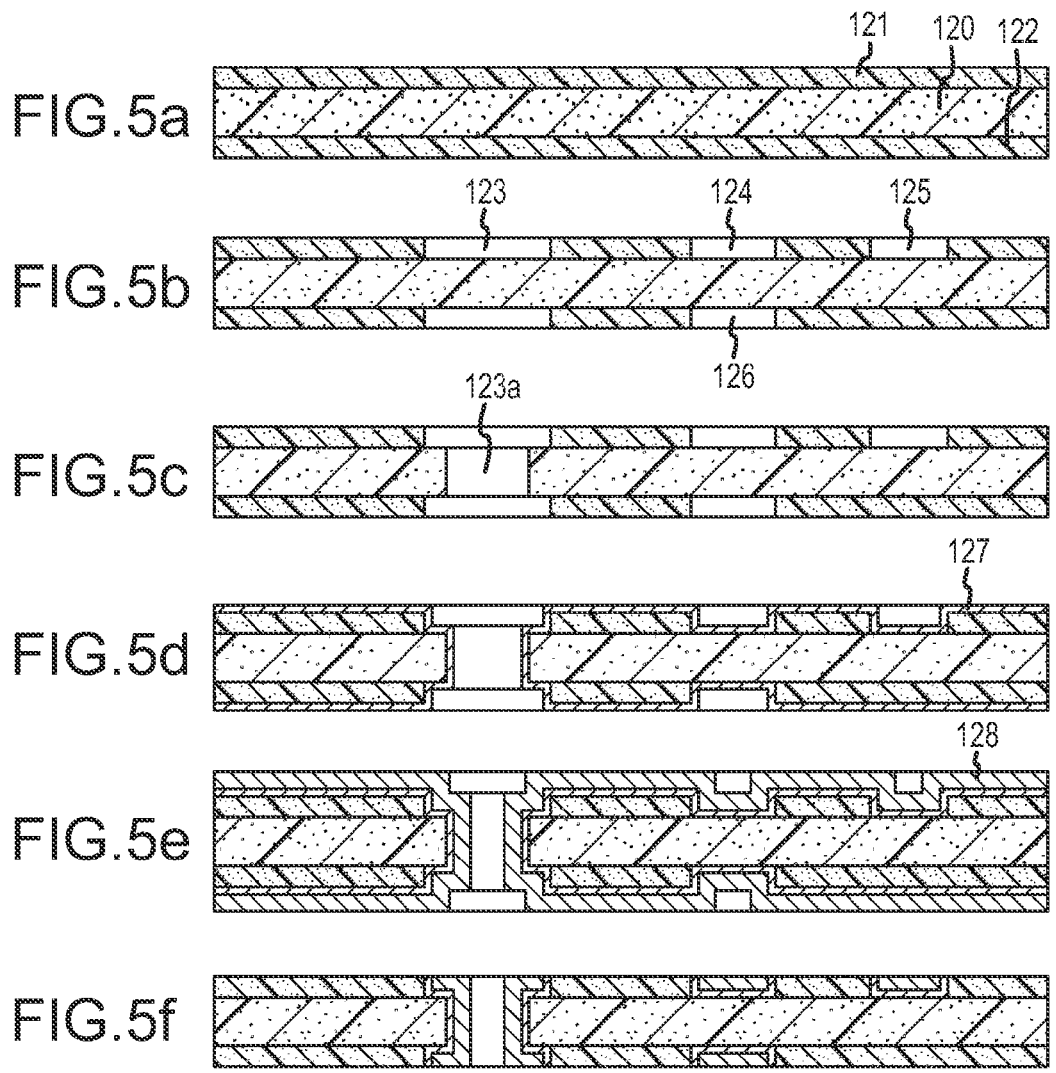

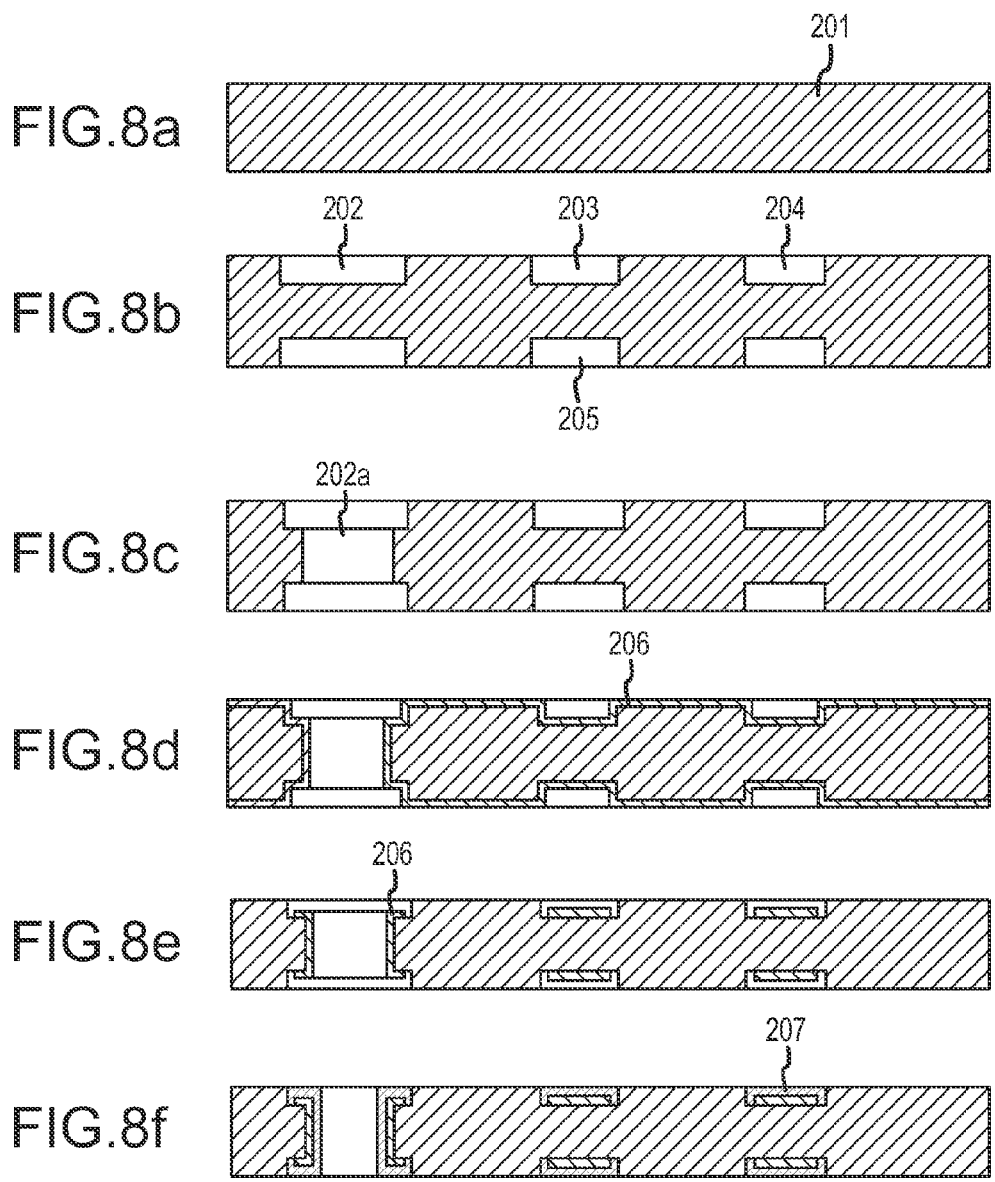

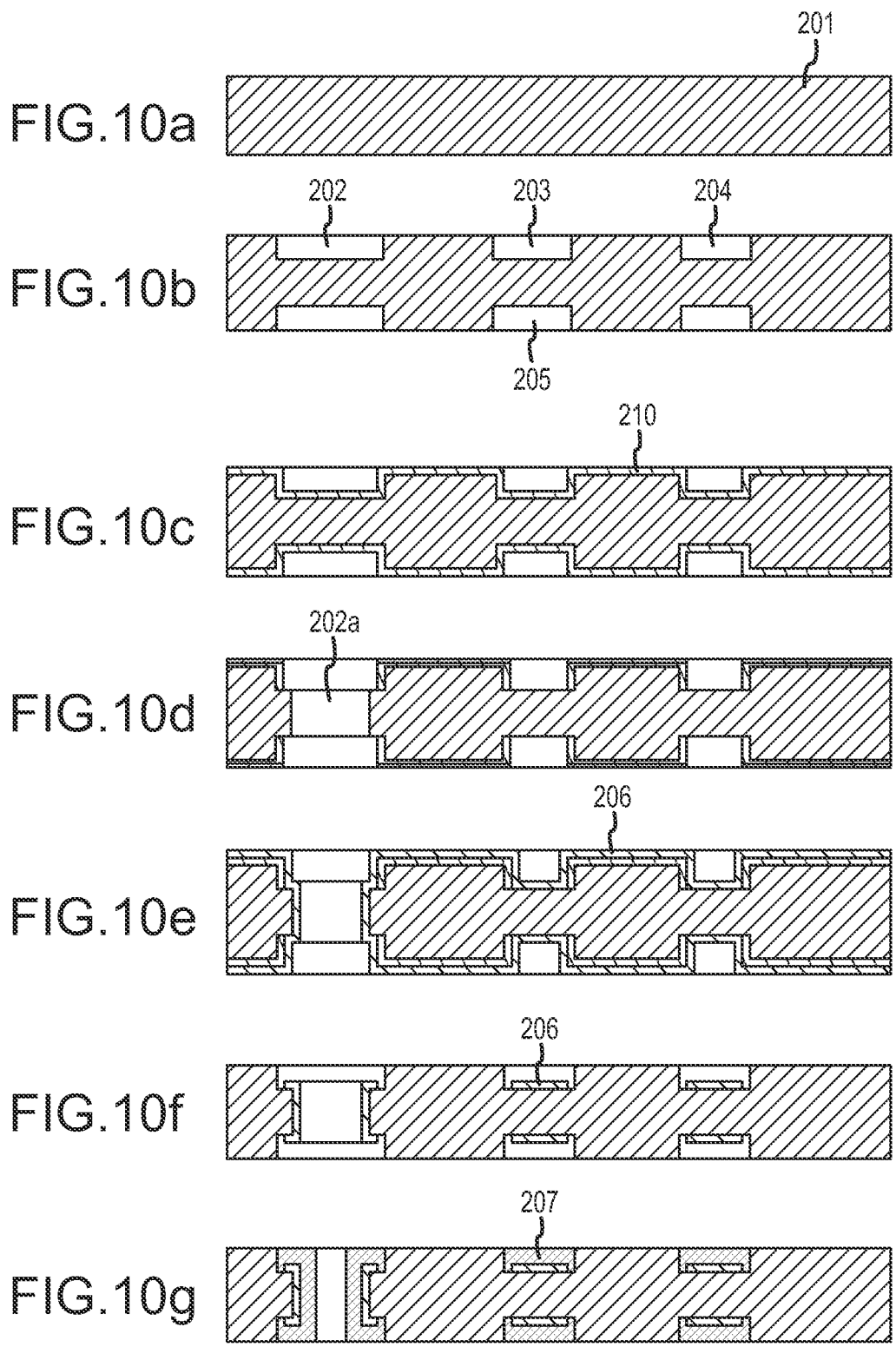

MINIATURE RFID TAG

CROSS-REFERENCE TO RELATED APPLICATION

This application claims priority under 35 U.S.C. 119 to U.S. Provisional Application No. 61/170,836, entitled: "MINIATURE RFID TAG," filed on Apr. 20, 2009, the contents of which are incorporated herein as if set forth in full.

BACKGROUND

Radio Frequency Identification (RFID) transponders (tags) are generally operated in conjunction with RFID base stations (RFID readers) for a variety of inventory-control, security, and other purposes. Typically, an item having a tag associated with it, for example, a container with a tag placed on or inside it, is brought into a "read zone" established by the base station. The RFID base station may transmit an interrogating RF signal that is modulated by a receiving RFID tag. For example, the RFID base station may generate a continuous wave (CW) electromagnetic disturbance at a certain (carrier) frequency, and this disturbance may be modulated by the RFID tag to correspond to data that is to be communicated via the disturbance back to the base station. The modulated disturbance, or signal, may communicate the information at a rate, referred to as the data rate, which is lower than the carrier frequency. The RFID tag may modulate the RF signal in order to impart to the signal information stored within the RFID tag and may then transmit the modulated, answering, RF signal to the base station.

RFID tags may be active, containing their own RF transmitter, or passive, having no transmitter. Passive RFID tags, i.e., tags that rely upon modulated back-scattering to provide a return link to an interrogating RFID base station, may include their own power sources, such as a batteries, or they may be "field-powered," whereby they obtain their operating power by rectifying an interrogating RF signal. Although both battery-powered and field-powered tags have minimum RF field strength read requirements, or read thresholds, in general, the range of a field-powered passive RFID tag may be limited by the amount of radiated power supplied from the RFID reader, and the range of an RFID tag having its own power source is limited by the signal to noise level of the total communications link. Because the interrogating signal must provide power to a field-powered passive RFID tag, the read threshold for a field-powered passive RFID tag is typically substantially higher than for an active RFID tag. However, because field-powered passive tags do not include their own power source, they may be substantially less expensive than active RFID tags, and because they have no battery to "run down," field-powered passive RFID tags may be more reliable in the long term than active RFID tags.

Although field-powered passive RFID tags provide cost, reliability, and environmental benefits, there may be obstacles to the efficient operation of field-powered passive RFID tags. In particular, it may be difficult to deliver sufficient power from a base station to a field-powered passive RFID tag via an interrogating signal. The amount of power a base station may impart to a signal is limited by a number of factors, for example, regulations by the Federal Communication Commission (FCC) regarding signal frequencies and power. Consequently, it would be highly advantageous to provide an RFID tag that may be compact, lightweight, low cost, disposable, and that efficiently employs a substantial portion of the signal energy that it receives from an interrogating base station.

It is against this background that the miniature RFID tags described herein have been invented.

SUMMARY

Disclosed herein is a method of manufacturing an inductor coil for an RFID tag, the inductor coil including a pattern of conductive traces. The method includes providing an electrically insulating substrate having a predetermined thickness defined by opposed surfaces; producing recesses in the electrically insulating substrate on at least one of the opposed surfaces, the recesses reaching to a controlled depth which is smaller than the thickness of the electrically insulating substrate, and the recesses forming a pattern on the surface of the electrically insulating substrate corresponding to the desired pattern of conductive traces of the inductor coil; and depositing conductive material within the recesses.

The recesses may be produced using at least one of laser ablation, hot embossing, and molding. Depositing conductive material within the recesses may include depositing conductive material on substantially an entire face of the electrically insulating substrate having the recesses formed therein; and removing conductive material from the surface of the substrate outside the pattern of conductive traces of the inductor coil. Depositing conductive material within the recesses may include creating an electrically-conductive region within the recesses; and depositing conductive material in the electrically-conductive region. Depositing conductive material within the recesses may include depositing a base layer on substantially an entire face of the electrically insulating substrate having the recesses formed therein; removing the base layer from the surface of the substrate outside the recesses; and depositing conductive material onto the base layer in the recesses. The inductor coil formed on the RFID tag may be shaped in the pattern of a spiral.

Also disclosed is an inductor coil for an RFID tag, the inductor coil including a pattern of conductive traces. The inductor coil includes an electrically insulating substrate having a predetermined thickness defined by opposing surfaces; one or more recesses in the electrically insulating substrate on at least one of the opposed surfaces, the recesses reaching to a controlled depth which is smaller than the thickness of the electrically insulating substrate, and the recesses forming a pattern on the surface of the electrically insulating substrate corresponding to the desired pattern of conductive traces of the inductor coil; and conductive material disposed substantially within the one or more recesses to form the pattern of conductive traces of the inductor coil.

The inductor coil may be shaped in the pattern of a spiral.

Also disclosed is an object tagged with an RFID tag. Included is an object and an RFID tag that is relatively thin in a first dimension and relatively larger in second and third orthogonal dimensions, the RFID tag being attached to the object. The RFID tag includes an electrically insulating substrate having a predetermined thickness along the first dimension, the thickness being defined by opposing surfaces; one or more recesses in the electrically insulating substrate on at least one of the opposed surfaces, the recesses reaching to a controlled depth which is smaller than the thickness of the electrically insulating substrate, and the recesses forming a pattern on the surface of the electrically insulating substrate corresponding to the desired pattern of conductive traces of an inductor coil on the RFID tag; and conductive material disposed substantially within the one or more recesses to form the pattern of conductive traces of the inductor coil.

The inductor coil formed on the RFID tag may have an inductance of at least 2 microhenries. The conductive traces of the inductor coil formed on the RFID tag may have a height of approximately 10 μm or less. The conductive traces of the inductor coil formed on the RFID tag may have a width of approximately 20 μm or less. The inductor coil formed on the RFID tag may be shaped in the pattern of a spiral. The object may have a cavity therein and the RFID tag may be attached to the object by being contained within the cavity. The containment of the RFID tag within the cavity may be achieved by overmolding plastic over the RFID tag.

BRIEF DESCRIPTION OF THE DRAWINGS

FIG. 4 is a diagrammatic illustration of process steps of a first embodiment of a method for the production of printed circuit boards;

FIG. 5 is a diagrammatic illustration of process steps of a second embodiment of a method for the production of printed circuit boards;

FIG. 8 shows a highly simplified schematic representation of the steps of a method for the production of printed circuit boards;

FIG. 10 shows a highly simplified schematic representation of the steps of a method for the production of printed circuit boards;

DETAILED DESCRIPTION

Figure 1:
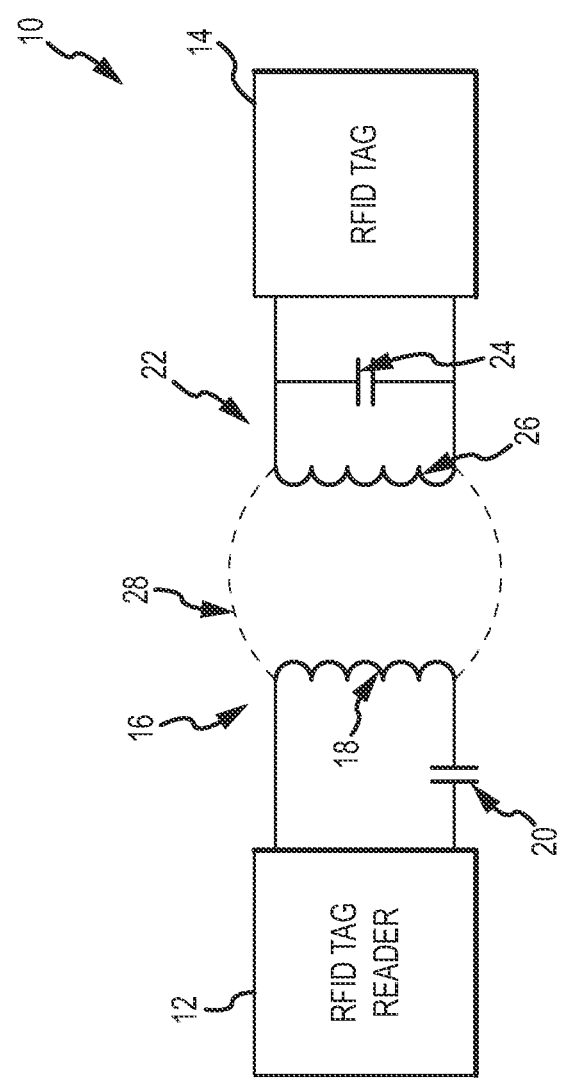
FIG. 1 illustrates a schematic block diagram of one embodiment of an exemplary RFID system.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention.

The embodiments disclosed herein relate to systems and associated methods for providing miniature RFID tags that may be attached or integrated into various devices including, but not limited to, medical products, disposable products, consumer products, and the like. The RFID tags may be substantially smaller in area, which may be advantageous in applications where size and/or weight is a consideration. Further, the cost associated with the RFID tags may be relatively low due to the materials requirements and due to the improved and simplified manufacturing methods. More specific details regarding the construction and operation of the RFID tags are described below.

FIG. 1 illustrates a schematic block diagram of a RFID system 10 that includes a RFID tag reader 12 and an RFID tag 14. The RFID tag reader 12 includes a tuned circuit 16 including an inductor 18 and a capacitor 20 connected in series. The RFID tag reader 12 may produce continuous wave (CW) RF power across the tuned circuit 16. This CW RF power may be electromagnetically coupled by alternating current action to a parallel resonant circuit antenna 22 of the RFID tag 14. The parallel resonant circuit antenna 22 may include an inductor 26 and a capacitor 24, one or both of which may be integrated into the RFID tag 14. The CW RF electromagnetic power is generally represented by the reference numeral 28. The RFID tag 14 may include a power converter or rectifier circuit that converts some of the CW RF electromagnetic power 28 into direct current power for use by logic circuits (e.g., integrated circuits) of the RFID tag 14. The RFID tag 14 may also include memory, modulation circuitry, or any other suitable circuitry that may be implemented, for example, in one or more integrated circuits.

When the parallel resonant circuit antenna 22 of the RFID tag 14 is in proximity to the tuned circuit 16 of the RFID tag reader 12, an AC voltage across the parallel resonant circuit antenna 22 may be developed. The AC voltage across the parallel resonant circuit antenna 22 may be rectified and when the rectified voltage becomes sufficient enough to activate the logic circuits of the RFID tag 14, the RFID tag 14 may be activated and start sending stored data by modulating the incoming RF carrier signal 28 of the RFID tag reader 12. As an example, the RFID tag 14 may use amplitude modulation to transmit a signal to the RFID tag reader 12. The RFID tag reader 12 may detect these modulated signals and convert them into a detected serial data word bit stream of on/off pulses representative of the information from the RFID tag 12. In this regard, the RFID tag reader 12 may decode the data in order to identify the device associated with the RFID tag 14. It should be appreciated that the RFID system 10 shown in FIG. 1 is provided for explanatory purposes, and that RFID systems employing other configurations may be used as well.

Figure 2B:
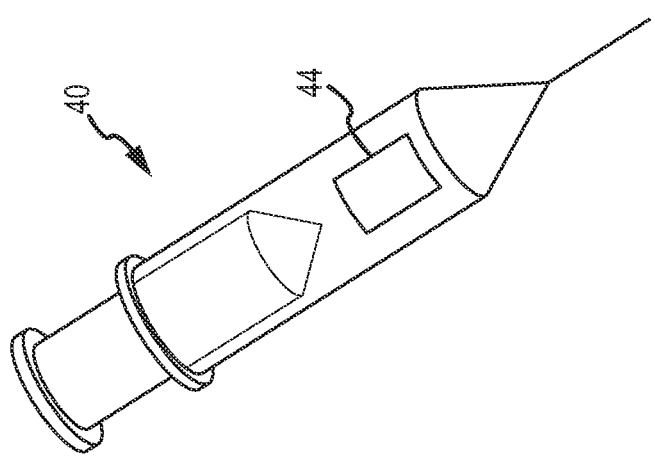
FIGS. 2A-2B illustrate two devices that are equipped with an RFID tag for use with an RFID system, such as the RFID system shown in FIG. 1.
Figure 2A:
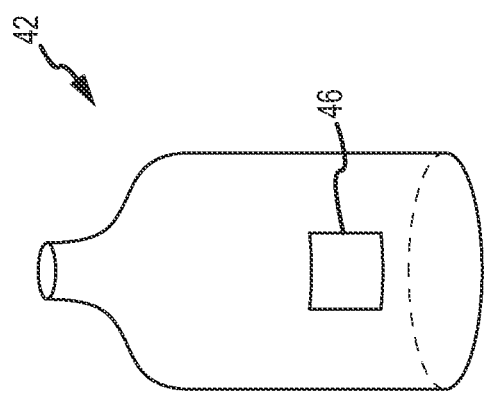

FIGS. 2A and 2B illustrate a syringe 40 and a bottle 42, respectively. The syringe 40 and bottle 42 are each equipped with an RFID tag (i.e., RFID tag 44 on the syringe 40 and RFID tag 46 on the syringe 42). As an example, each of the RFID tags 44, 46 may include a write/read memory for storing information and a built-in antenna for communicating with a RFID tag reader. The RFID tags 44, 46 attached to each of the syringe 40 and bottle 42 may store information related to the product contained therein. For example, the information in the RFID tags 44, 46 may include product information, such as a serial number and/or a National Drug Code (NDC) associated with a medical product, a product name, a manufacture's name, a lot number, and/or an expiration date.

Alternatively or additionally, the information in the RFID tags 44, 46 may include a product identifier uniquely associated with one or more entries in a database that may be accessed to obtain information related to the product. The information in the RFID tags 44, 46 may also include dosage information, identifying the amount and/or concentration of a medical product, and/or a patient identifier identifying a patient intended to receive the medical product. Other optional information may include administration requirements, instructions for use and/or product warning, such as possible allergic reactions or adverse interaction of the product with other products. Information may be written into the RFID tags 44, 46 by a manufacturer and/or the facility receiving and/or transporting the associated product. Some or all of the information in the RFID tags 44, 46 may also be printed on the outer surface of the RFID tag 44, 46 so that a user may visually read the information.

Each of the RFID tags 44, 46 may be made thin and flexible, allowing the RFID tags 44, 46 to be attached to a device, such as the syringe 40, the bottle 42, or the like, so that the RFID tags 44,46 do not interfere with use of the device. Additionally, the RFID tags 44, 46 may be integrated into the material (e.g., plastic) of a device. For example, the RFID tags 44, 46 may be integrated by overmolding plastic over them, or by encapsulating them inside a cavity of a device.

Figure 3:
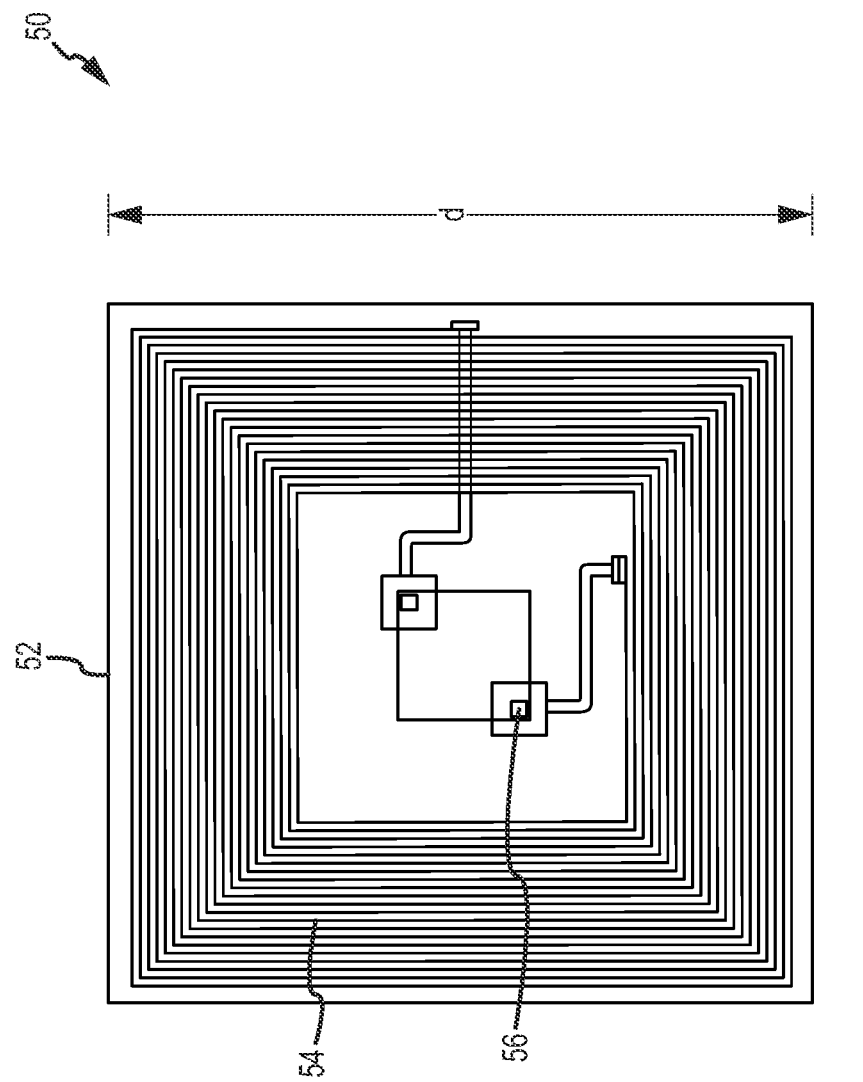
FIG. 3 illustrates one embodiment of an inductor coil that may be included in a miniature RFID tag.

FIG. 3 illustrates a schematic plan view of an RFID tag 50 according to one embodiment. The RFID tag 50 includes an inductor coil 54 that is disposed on a surface of an insulated substrate 52. The inductor coil 54 may be a component in a resonant circuit of the RFID tag 50, such as the resonant circuit 22 shown in FIG. 1. The substrate 52 may be, for example, made from PET, mylar, paper, plastic, kapton, polyimide, or the like, or any combination thereof. In this example the inductor coil 54 is a spiral coil having two ends, an inner end, and an outer end. Generally, logic circuits (not shown) of the RFID tag 50 may be located on the inside of the coil 54. Connection pads 56 may be used to connect each end of the inductor coil 54 to a circuit of the RFID tag 50, such as one or more integrated circuits. The one or more integrated circuits may be manufactured using any suitable processes and materials (e.g., silicon ICs).

As shown, the coil 54 may include a plurality of straight sections that are disposed at angles of substantially 90 degrees from each other. Further, although the inductor coil 54 is shown in the shape of a "square spiral," other configurations are contemplated (e.g., rectangular spiral, circular spiral, hexagonal spiral, other spirals, or other configurations).

The inductor coil 54 may be made of material that is electrically conductive and may include, for example, metal such as copper and aluminum, plated metal, electrically conductive organic and inorganic materials, and the like.

In order to achieve desired performance, the inductor coil 54 may have a sufficient amount of inductance (e.g., a few micro henries (uH), or more). Further, it is desirable that the resistance of the inductor coil 54 may be relatively low, so that the losses in the inductor coil 54 do not reduce the performance of the RFID tag 50. Additionally, the RFID tag 50 may have a relatively small area (e.g., 5 mm by 5 mm square, or less), so that it may be attached or integrated into a device without interfering with the device's intended use, and so that the cost of the RFID tags may be relatively low since less material may be required.

To provide a large enough inductance value, the inductor coil 54 includes a spiral trace covering a sufficient area. In a design having a relatively small footprint, the coil 54 may require more turns, and therefore relatively thin conductive traces to fit within the smaller area. As noted above, since the losses of the inductor coil 54 are dependent on the resistance of the traces, a relatively thick trace may be required to achieve a low resistance value. For example, the trace height for the inductor coil 54 may be about 10 um, and the trace width may be about 20 um.

To achieve the above-noted design goals and features, manufacturing processes characterized by having the conductive traces of the inductor coil 54 built into an engraved trench inside the base substrate 52 are provided. The engraved trench structure or substrate may be achieved on a polymer such as polyimide, PC, PET, PEN, LCP or other suitable material. The processes used for engraving the trenches may be laser ablation, hot embossing, molding, or other suitable processes.

Hot embossing is essentially the stamping of a pattern into a material (e.g., a polymer) softened by raising the temperature of the material just above its glass transition temperature. The stamp used to define the pattern in the material may be made in a variety of ways including micromachining from silicon, lithography, machining using a computer numerical controlled (CNC) tool (for making large features), or the like. A wide variety of polymers have been successfully hot embossed with micron-scale (and below) size features, including polycarbonate and PMMA. This technique may be used for engraving the trenches. The benefits of this approach may include the ability to take advantage of the wide range of properties of polymers, as well as the potential to economically mass produce parts with less than micron-scale features.

The RFID tags described herein allow new applications where disposable devices are used in co-operation with a RFID tag reader. Because of the small size of the RFID tags of the present embodiments, it is possible to embed the RFID tags into various disposable devices, such as drug vials, electrochemical test strips, tubes sets, and the like. The integration of RFID systems into the disposable devices permits new applications of limiting usage, brand protection, exchanging vital information such as expiration dates, protection from hazards, and other useful applications.

FIGS. 4-14 and their related discussion below relate to various methods that may be employed for manufacturing RFID inductor coils, such as the RFID inductor coil 54 shown in FIG. 3. The methods permit the production of RFID tags that are relatively small in size, provide high performance, and are relatively low cost.

FIGS. 4a-4g are diagrammatic illustrations of steps of a first embodiment of the method of the invention. According to FIG. 4a, the starting material is an electric insulating foil, i.e. substrate, 101 made of a dielectric material, for example polyimide. The thickness of the foil 101 may range from about 10 to about 80 micrometers. In a first process step, illustrated in FIG. 4b, recesses 102,103,104,105 are produced in the foil 101 by laser ablation using a pulsed or continuous excimer laser beam which is transmitted through a corresponding mask to be incident on an upper face of foil 101. The recesses 103, 104, 105 correspond to the desired positions of conductor structures to be formed on the printed circuit board; the recess 102 is produced at a location where a through-hole 102a will be produced in the subsequent step (FIG. 4c).

The depth of the recesses 103, 104, 105 is controlled by controlling the total amount of laser energy incident on the foil 101. This energy can be adjusted, for example, by appropriate control of the number of laser pulses impinging on the foil or by controlling the total time during which the foil is irradiated with the continuous laser beam. The recesses 102, 103, 104, 105 typically may have a depth of about 1 to 20 micrometers. In order to ensure that the laser beam impinges on the foil 101 only at the locations where conductor structures and holes are to be produced, a mask having transparent portions corresponding to the desired pattern of conductor structures 103 and 104 and hole 102a is superposed on the upper face of foil 101; a similar mask is superposed on the foil lower face for recess 105. Thus, a pattern of lines is created in the foil 101 corresponding to the desired pattern of conductor structures.

In the next step, illustrated in FIG. 4c, a desired through-hole 102a is produced in foil 101 by laser ablation. For this purpose, the foil 101 is irradiated again with an excimer laser at the locations where holes are to be created through a mask having portions transparent to the laser beam only at the locations corresponding to the holes. Typical diameters of through-hole 102a range from about 20 to about 50 micrometers.

Then, foil 101 may be cleaned to remove any residues from the laser ablation process, either by using an oxygen plasma or an aqueous medium.

In the next step according to FIG. 4d, substantially the entire areas of upper and lower faces of foil 101 and recesses 103, 104, 105 are metallized, as are the inner walls of the through-holes 102a. This metallization step may be performed by a physical vapor deposition (PVD) process, such as sputtering or anodic or cathodic arc evaporation. As a result of the PVD process, an approximately 200 nm thick metal layer 107 may be deposited on the surface of the foil 101. Typically, the metal layer 107 includes copper; other metals, however, such as silver, can be used. To improve adhesion of the PVD layer 107 to foil 101, an adhesive layer, such as nickel, chromium, palladium, or silver may be deposited before deposition of the PVD layer on the dielectric substrate 101, or applied in the PVD process. Alternatively, the dielectric substrate 101 can be activated in a plasma before the metal deposition step of FIG. 4d.

Thereafter, an additional metal layer 108 (e.g., copper) may be deposited on the PVD layer 107 either by chemical metal deposition or by a galvanic process (electroplating). According to a practical example, the thickness of the resulting layer 108 (shown in FIG. 4e) ranges from about 10 to 40 micrometers. In this example, the thickness of the layer 108 substantially equals the depth of the recesses 102, 103, 104, 105.

In the next step, metal (e.g. copper) is removed from those areas on the foil 101 where no conductor structures are desired in the final printed circuit. This removal of metal outside the desired conductor structures may be performed by a mechanical processing step, such as grinding, polishing, or milling. The resulting structure is shown in FIG. 4f. Thus, metal is left only where conductor structures are desired, as shown by conducting regions 109, 110 and 111 in recesses 103, 104 and 105, and in through-hole 102a. Thereafter, insulating foil 101 may be electrochemically polished or briefly chemically etched to compensate for surface irregularities and to ensure a sufficiently safe process.

Then, electric insulating dielectric foils or layers 112 and 113 are respectively laminated to the top and bottom faces of the thus produced two-layer printed circuit. The result is shown in FIG. 4g. At those locations of the printed circuit which have to be electrically accessible, for example for mounting components, openings are produced in one or both of dielectric foils 112 and 113. For producing such openings, a laser ablation process may be performed using an appropriate mask so that the laser beam impinges only on those spots of foils 112 and 113 where openings are to be made.

To produce multi-layer printed circuits, dielectric foils 112 and 113 are laminated to both faces of the printed circuit formed on substrate 101 after the mechanical removal (grinding) of excess metal as indicated by the step of FIG. 4f, and the process as described above is repeated. It may be possible to create blind holes, which provide access to layers underneath as well as through-holes.

In the process described above, through-holes 102a and recesses 103, 104, 105 are created in two steps, as shown in FIGS. 4b and 4c. As an alternative thereto, one could perform the ablation in a single step. According to this embodiment, a change-over mask is used, and the foil 101 is processed by laser ablation at the locations of the recesses 103, 104, 105 and at the locations of the holes 102a until the recesses have the required depth. Then the mask is changed and only the holes 102a are further ablated until the desired passage through the foil 101 has been created.

In the following, an alternative embodiment to the one described in connection with FIGS. 4a-4g is described with reference to FIGS. 5a-5f. The process starts with an electric insulating dielectric foil 120 to which electric insulating dielectric foils 121 and 122 of a different material from that of the foil 120 are laminated on both faces of foil 120, as illustrated in FIG. 4a. In the first step illustrated in FIG. 5b, the desired pattern of conductor structures 124, 125, 126 as well as recesses 123 at the locations where through-holes are desired, are produced in the foils 121 and 122 by laser ablation. In the next step, illustrated in FIG. 5c, the through-holes 123a are produced by laser ablation. Foils 121 and 122 are formed of a material that can be ablated more easily than the material of the foil 120, e.g. foils 121 and 122 are made of an insulator having a considerably lower vaporization temperature than the insulator of substrate or foil 120. In that way, the depths of the recesses 124, 125, 126 can be precisely controlled. The depths of the recesses 124, 125, 126 are substantially equal to the thicknesses of foils 121 and 122. Then the entire upper and lower exposed faces of the composite structure are metallized by physical vapor deposition to form metal layers 127 as shown in FIG. 5d.

Thereafter, additional metal layers 128 are deposited by electroplating on the vapor deposited layers 127, as shown in FIG. 5e. Then, according to FIG. 5f, the upper and lower faces of the metallized foil structure shown in FIG. 5e are mechanically processed by grinding, polishing or milling, so that the metal (copper) only remains at the desired locations in recesses 124, 125, 126 and in the hole 123a. In the present embodiment, the laser ablation is performed with the same equipment as in the first embodiment, i.e., using a mask with a corresponding pattern of desired conductor structures and holes. The present embodiment of the invention has the advantage that the ablation process can be used with lasers which cannot be controlled as precisely as an excimer laser for producing the required depths in the dielectric material of foil or substrate 120. The reason is that the depth is mainly determined by the thickness of layers 121 and 122 and because layers 121 and 122 are more easily ablated than substrate 120.

A third embodiment of the method of the invention is now described with reference to FIGS. 6a-6d. According to FIG. 6a, the process starts with an electric insulating dielectric foil 130 having different electric insulating dielectric foils 131 and 132 laminated on the top and bottom faces of foil or substrate 130. A feature of this embodiment is that substrate 130 includes a substance which, when irradiated by a laser beam, changes from an electric insulator to an electrical conductor. Examples of such materials having laser-induced electrical conductivity are the organic polymers poly (bis ethylthio-acetylene) and poly (bis alkylthio acetylene). Materials of the mentioned type are described in: R. Baumann et al.: "Local Electrical Conductivity in Poly (Bis-Alkylthio-Acetylene) Layers After Laser Irradiation", Synthetic Metals (1993), Pages 3643-3648. The dielectric foils 131 and 132 do not have the laser-induced electrical conductivity characteristics of foil 130.

Figure 6A:
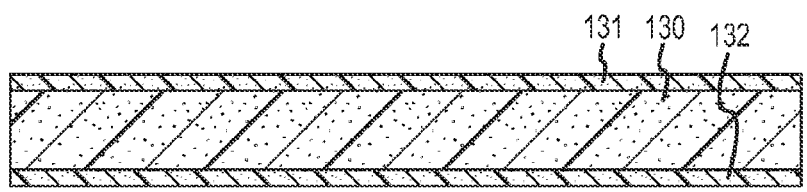
FIG. 6 is a diagrammatic illustration of process steps of a third embodiment of a method for the production of printed circuit boards.
Figure 6B:
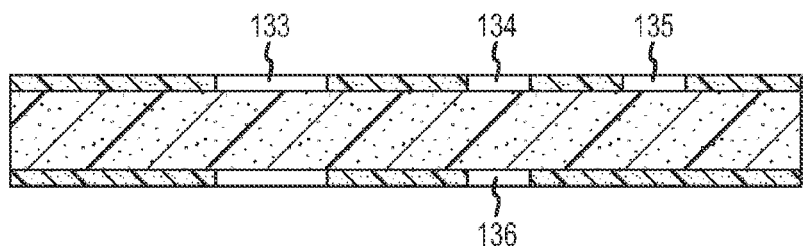
Figure 6C:
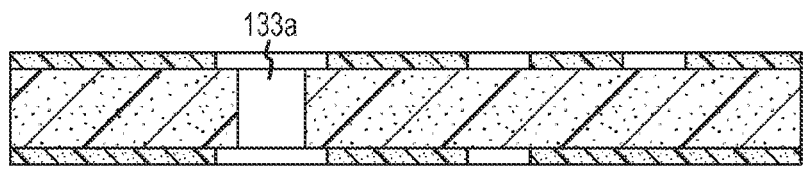
Figure 6D:

In a first step, illustrated in FIG. 6b, recesses 134, 135, 136 are formed by laser ablation in foils 131 and 132 where conductor structures are to be located; simultaneously recesses 133 are formed in laminated foils 131 and 132 by laser ablation at the location where a through-hole is desired. When the laser beam has ablated the portions of foils 131 and 132 where structures 134, 135 and 136 and recess 133 are to be located and becomes incident on substrate 130, the portion of the substrate so irradiated becomes electrically conductive. In the next step, according to FIG. 6c, through-hole 133a is produced by laser ablation. Then recesses 134, 135, 136 are filled with metal (e.g. copper) by electroless plating to produce the structure shown in FIG. 6d. One of the advantages of this embodiment is that removal of excess material is not required. The metal is only deposited at the locations 134, 135, 136 which have been irradiated by the laser. Furthermore, little or no waste products are produced, making the method environmentally beneficial. As an alternative to the electroless plating, the copper can also be applied by electroplating, provided all structures, such as structures 134, 135, 136, are connected via an electric contact line for plating.

It is to be understood that all the above-described processes can also be used for producing multi-layer printed circuit boards by merely repeating the described process steps.

In an embodiment of the invention, the mask used for laser ablation to form the desired recesses in the dielectric substrate may be, for example, a phase mask. Such a phase mask includes a quartz substrate on which dielectric layers are applied. The dielectric layers are removed from those locations of the mask corresponding to through holes in the substrate. Only some of the dielectric layers are removed from those locations of the mask corresponding to recesses in the substrate. Such a phase mask has the advantage of enabling holes and recesses for conductor structures to be created in a single process step. As an alternative thereto, the laser ablation can be performed without a mask, either by directly "writing" the laser beam on the substrate or by using an adaptive optical system. Direct writing on the substrate is accomplished either by deflecting a laser beam using, for example, a system of mirrors or refractive elements, or by moving the substrate relative to a stationary beam.

Figure 7:
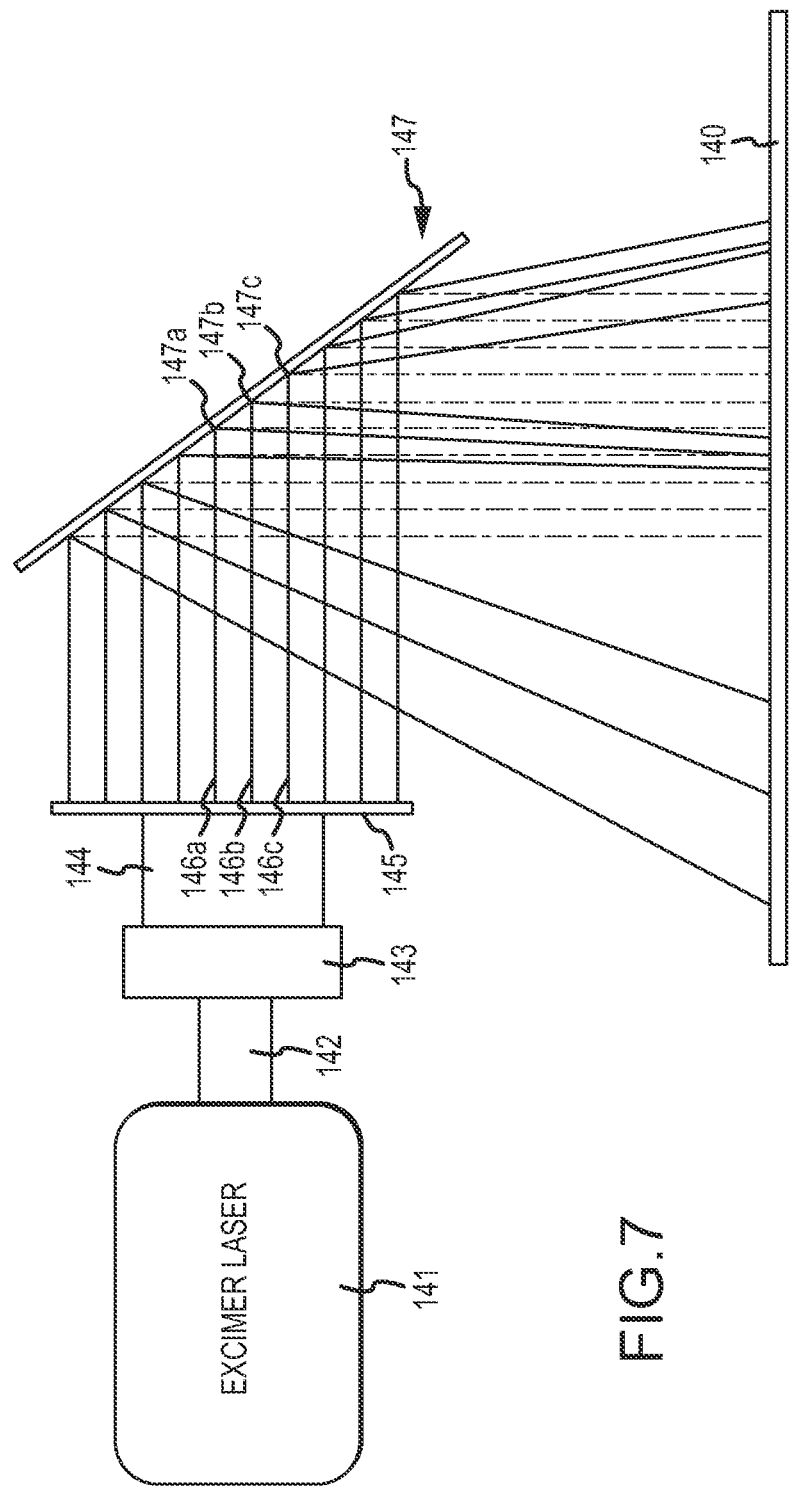
FIG. 7 is a schematic drawing of an optical system used in an embodiment of a method for the production of printed circuit boards.

The mentioned adaptive optical system is now described with reference to FIG. 7 wherein substrate 140 is to be processed by laser ablation. Laser beam 142 emitted by excimer laser 141 is transformed by homogenizer 143 into a wide, spatially homogeneous beam 144 that is incident on a two-dimensional array 145 of microlenses. The microlens array 145 is manufactured from a single plate and includes several thousand individual lenses (typically about ten thousand). According to a practical example, each of the lenses of array 142 has an outer diameter of about 100 micrometers. The microlens array 145 produces from the incident beam 144a a plurality of individual beams, such as beams 146a, 146b, 146c. Beams 146a, 146b, 146c are respectively incident on corresponding mirror elements 147a, 147b, 147c of adaptive reflector 147. Each of the mirror elements of adaptive reflector 147 is individually adjusted by a separate piezoelectric drive. By corresponding control of the mirror elements of reflector 147, the beams from microlens array 145 are directed to the desired locations on the substrate 140. Thus the desired pattern of recesses and holes in the substrate is created by laser ablation. By appropriate control of the energy density of the laser beam radiation, holes and conductor structures can be produced simultaneously. The mirror elements of the adaptive reflector 147 can be moved by their associated piezoelectric drives during the laser irradiation in order to produce the desired pattern of conductor structures. A galvanometer drive could be used as an alternative to the mentioned piezoelectric drive of the mirror elements.

It is understood that the adaptive optical system described in connection with FIG. 7 can be used as an optical system for laser ablation with any of the previously described embodiments of the process of the invention.

The material of the dielectric substrate is, for example, polyimide, but other materials can also be used, such as epoxy resin, cyanate ester, polyester, polyphenylsulfide, polytetrafluorethylene, bismaleimidtriaizine. The substrate can be processed in the form of individual cut sheets or from a reel on which the plastic material is wound. Even though the dielectric substrate in one embodiment of the invention is a thin foil, the invention is not limited thereto, but other forms of dielectric material can also be used, for example a dielectric carrier board.

The substrate 201 of FIGS. 8a through 14f, represents a cross-section through a base material for a highly integrated printed circuit board. Polymer sheets which are resistant to high temperatures are normally utilized as materials for this type of printed circuit boards with polyimide sheets being utilized in the embodiment described. The substrate shown is first attached to a support frame (not shown) for stabilizing the thin foil to provide easier handling for the individual processing steps. After attachment to a support, material is removed from the substrate at the locations corresponding to the subsequent conductive leads 202, 203, 204, 205 in accordance with FIG. 8b. This removal of material effects production of the conductive pattern and is done by means of ablation using a pulsed excimer laser. A through hole 202a is produced in accordance with FIG. 8c by means of additional material removal at the locations corresponding to the subsequent plated through holes likewise using an excimer laser.

A pulsed excimer laser in the UV-region that may be utilized for the ablation provides a laser beam that is structured using a mask corresponding to the desired structure of conductive paths and plated through holes. Alternatively, processing can take place using focussed laser radiation. The motion of the focussed laser beam relative to the substrate can be freely controlled. An adaptive optical system is utilized for steering the laser beam, the system having a plurality of alignable reflecting elements for deflecting various individual beams of the laser directly onto the substrate.

A ground layer, indicated in FIG. 8d as thin layer 206, is then introduced following material removal to form the conductive tracks and/or plated through holes. Clearly, the base layer 206 can be introduced onto the surface of the substrate 201 and the walls of the recesses 202, 203, 204, 205 or holes 202a. Conventional wetting processes, PVD/CVD processes or laser-supported deposition methods can be utilized to apply base layer 206.

After its introduction, the base layer 206 is, in accordance with FIG. 8e, removed from those regions of the substrate 201 which do not correspond to the subsequent conductive tracks and plated through holes. This selective removal of the base layer 206 corresponds to the production of a negative conductive pattern and is effected by means of ablation using a pulsed excimer laser.

Following selective ablation of the base layer 206, a metallic layer 207 is chemically deposited in accordance with FIG. 8f for subsequent production of the conductive tracks and plated through holes.

Figure 9A:
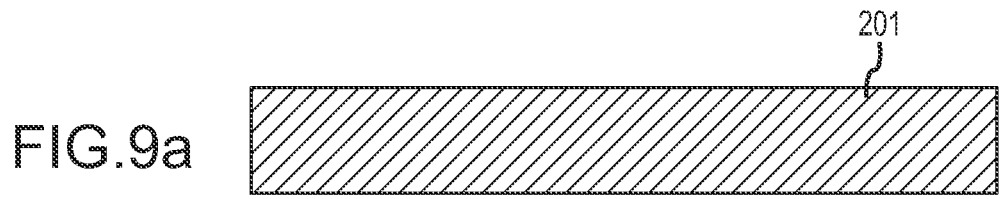
FIG. 9 shows a highly simplified schematic representation of the steps of a method for the production of printed circuit boards.
Figure 9B:
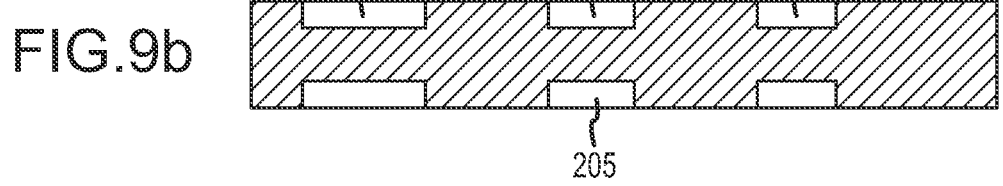
Figure 9C:
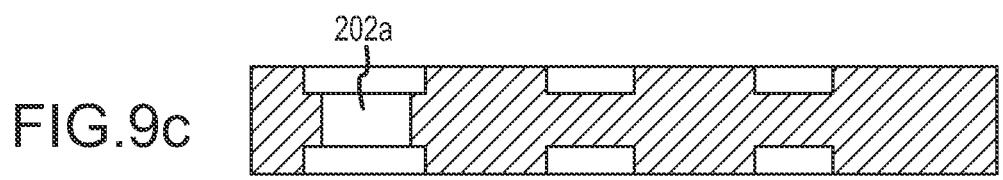
Figure 9D:
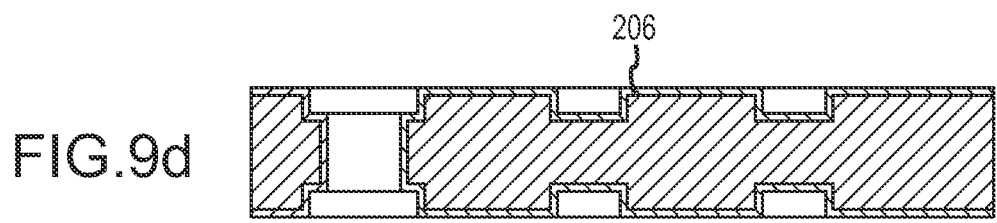
Figure 9E:
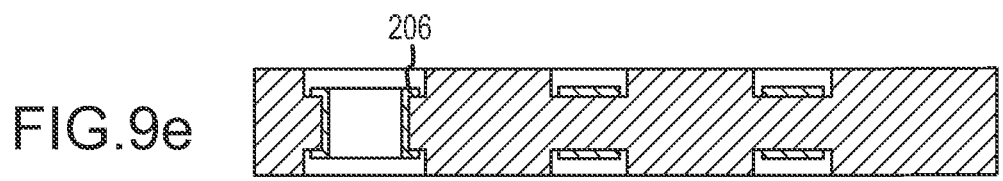
Figure 9F:
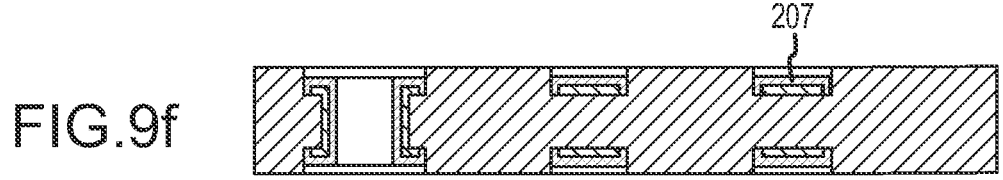
Figure 9G:
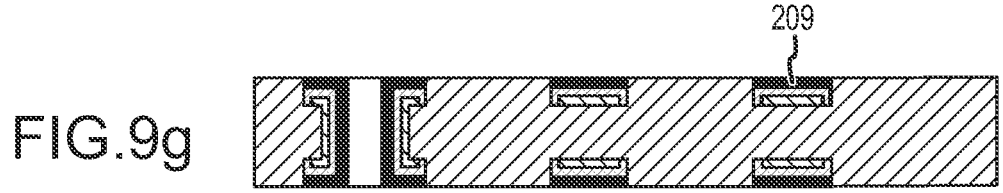

In accordance with the variations illustrated with regard to FIGS. 9a through 9g, and in accordance with FIG. 9f, following selective ablation of the base layer 206a thin metallic layer 207 is chemically deposited in the regions corresponding to the subsequent conductive tracks and plated through holes. Metal 207 may be currentless deposited copper. In accordance with FIG. 9g, the conductive tracks and the plated through holes are strengthened using a galvanically deposited metal 209 for production of the printed circuit board.

In the variations represented in accordance with FIGS. 10*a* through 10*g*, a removable cover layer 210 is introduced subsequent to ablation of the regions 202, 203, 204, 205 which correspond to the conductive tracks. Ablation of the substrate material and of the cover layer 210 in the regions 202*a* corresponding to the through holes and ablation of the cover layer 210 in the regions corresponding to the conductive tracks then takes place. The base layer 206 is first introduced following this step. Clearly, the base layer 206 can be introduced onto the surface of the cover layer, onto the floor of the conductive track structures and onto the walls of the holes in the substrate. Conventional wetting processes, PVD/CVD methods or laser-supported deposition procedures can be utilized for application of this base layer 206. The cover layer 210 can then be removed using a so-called lift-off process. As shown in FIG. 10*f*, the removal of the cover layer 210 coincides with removal of the base layer 206 from the regions outside of the subsequent conductive tracks and plated through holes. In accordance with FIG. 10*g*, a conductive metallic layer 207 is chemically deposited for production of the subsequent conductive tracks and plated through holes. The lift-off process can be carried out using chemical wetting processes or by means of a mechanical removal procedure.

Figure 11A:
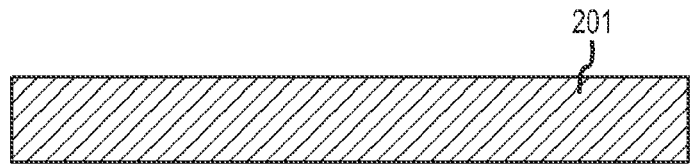
FIG. 11 shows a highly simplified schematic representation of the steps of a method for the production of printed circuit boards.
Figure 11B:
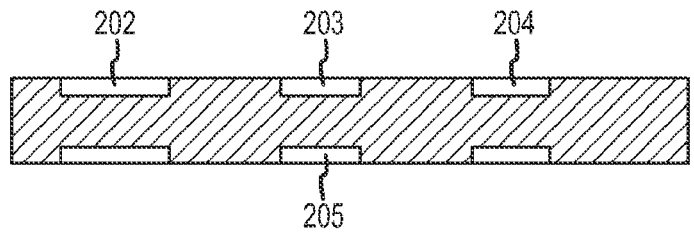
Figure 11C:
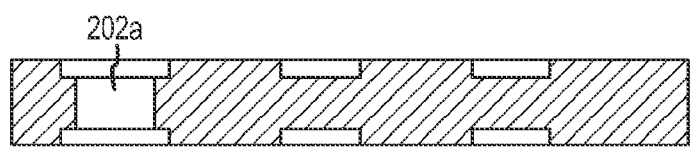
Figure 11D:
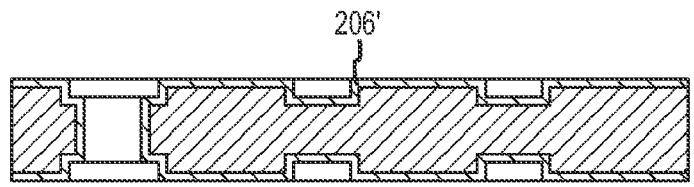
Figure 11E:
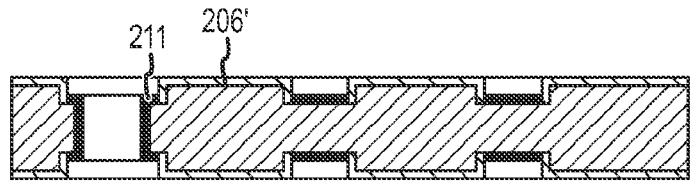
Figure 11F:
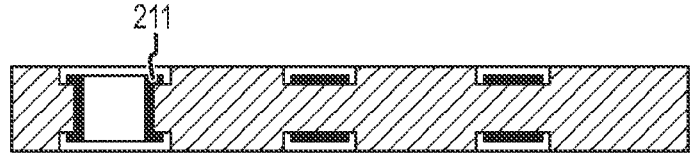
Figure 11G:
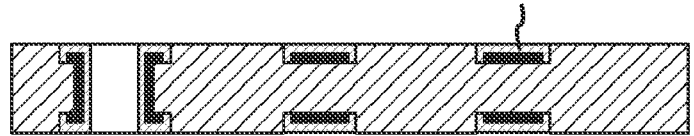
Figure 12A:
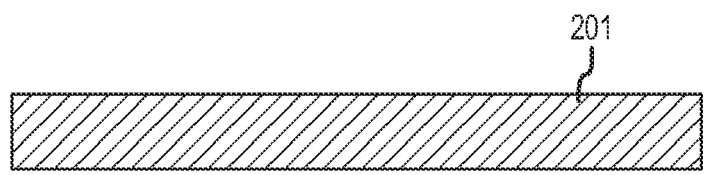
FIG. 12 shows a highly simplified schematic representation of the steps of a method for the production of printed circuit boards.
Figure 12B:
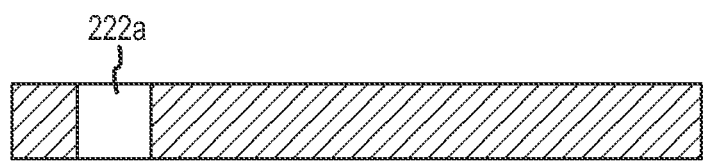
Figure 12C:
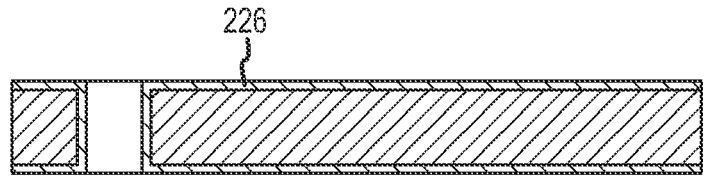
Figure 12D:
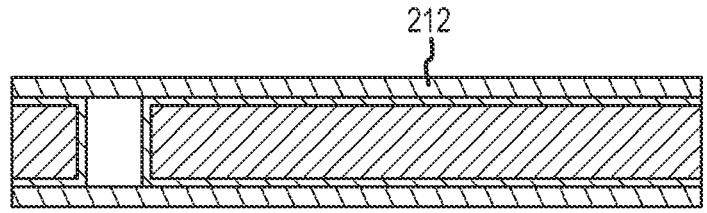
Figure 12E:
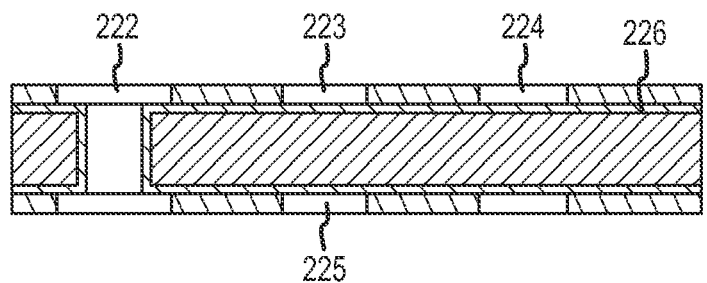
Figure 12F:
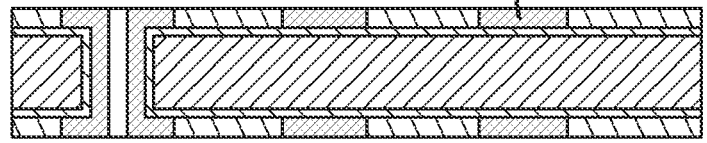
Figure 13A:
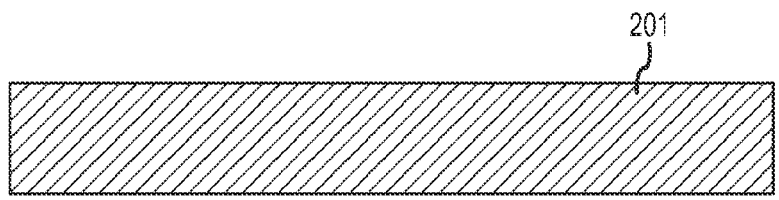
FIG. 13 shows a highly simplified schematic representation of the steps of a method for the production of printed circuit boards.
Figure 13B:
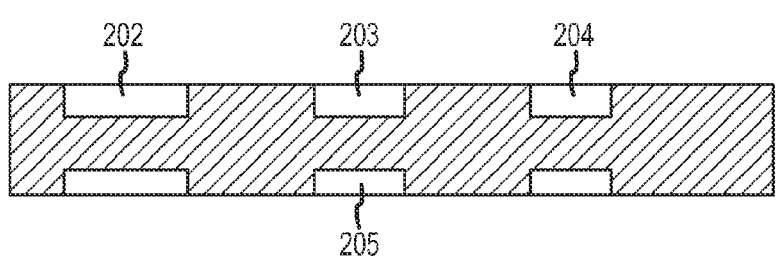
Figure 13C:
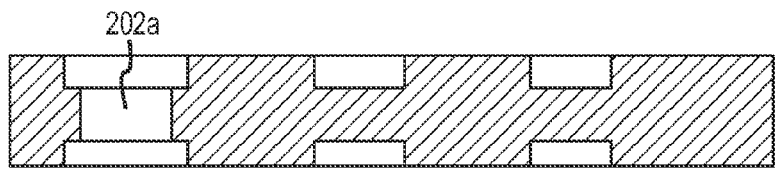
Figure 13D:
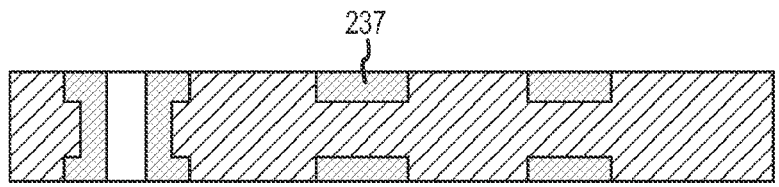

In the variations shown in FIGS. 11*a* through 11*g*, the fully covering base layer 206' is structured in a defined fashion with the assistance of electromagnetic radiation, e.g. with the assistance of laser radiation. Binding seeds 211 are freed in the regions of the subsequent conductive tracks and the plated through holes through the influence of the electromagnetic radiation. The non-irradiated portions of the base layer 206' are, as seen in FIG. 11*f*, rinsed-off. In accordance with FIG. 11*g*, a conductive metallic layer 207 is chemically or galvanically deposited for production of the subsequent conductive tracks and plated through holes.

In the variation represented in accordance with FIGS. 12*a* through 12*f*, regions of the subsequent plated through holes 222*a* are initially removed by means of electromagnetic radiation. A base layer 226 is then applied over the entire surface. Conventional wetting processes can be utilized for introduction of the non-conductive base layer 226. A detachable and/or laser-removable cover layer 212 is then applied over the entire surface, likewise using conventional methods. Recesses 222, 223, 224, 225, produced in this cover layer 212 with the assistance of electromagnetic radiation, correspond to the subsequent conductive tracks. The base layer 226 is freed in accordance with FIG. 12*e* through ablation of the cover layer 212 in these regions. In the subsequent step, conductive material 227 can be selectively deposited in these regions of the subsequent conductive tracks and plated through holes. Alternatively, the conductive track structures can be produced in a photo-sensitive dielectric material through exposure and development.

In the variations represented in FIGS. 13*a* through 13*d*, the regions of the subsequent conductive tracks 202, 203, 204, 205 and plated through holes 202*a* are subjected to electromagnetic radiation. This irradiation causes deposit of conductive material 237 during a chemical wet bath in the regions of the subsequent conductive tracks 202, 203, 204, 205 and plated through holes 202*a*.

Figure 14A:
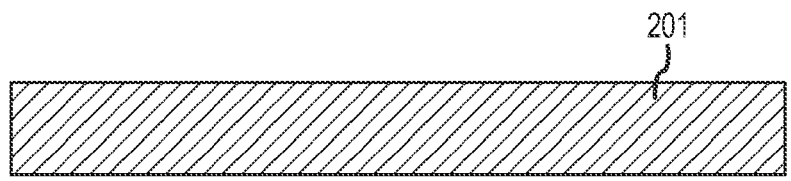
FIG. 14 shows a highly simplified schematic representation of the steps of a method for the production of printed circuit boards.
Figure 14B:
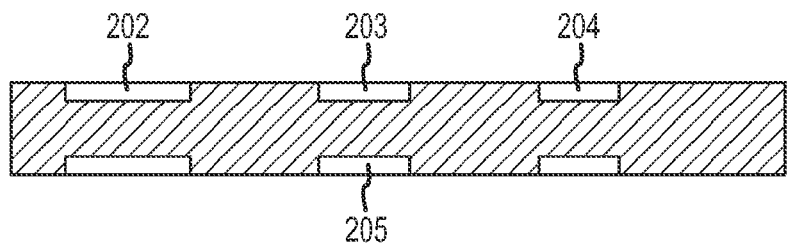
Figure 14C:
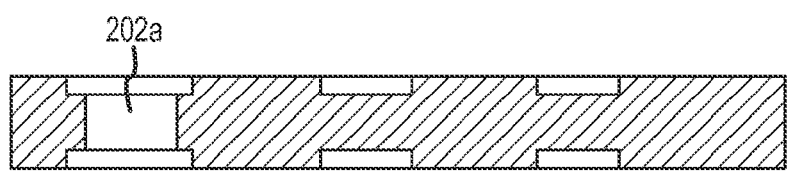
Figure 14D:
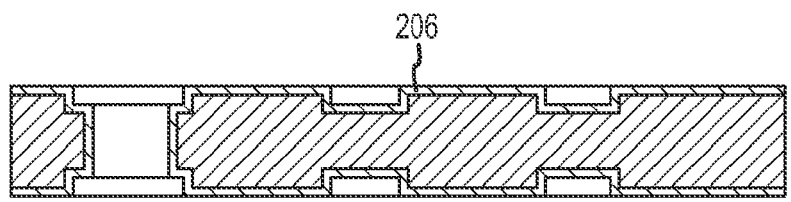
Figure 14E:
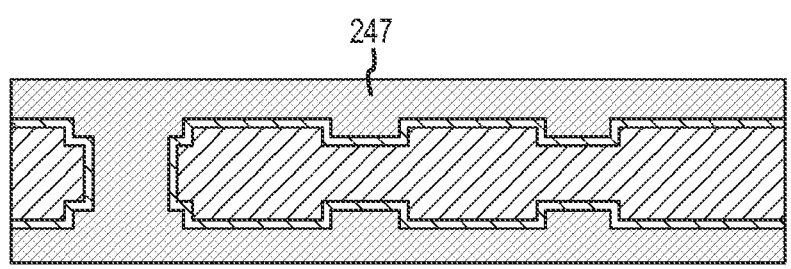
Figure 14F:

In the variations represented in FIGS. 14*a* through 14*f*, ablation of the base layer 206 in the unnecessary regions is not required after the step shown in FIG. 14*d*. FIG. 14*e* shows that conductive material 247 is deposited on the base layer 206 using chemical or galvanic methods until a flat surface is produced. The layer including conductive material 247 and the base layer are removed in a subsequent etching process until conductive material 247 only remains in the conductive tracks 202, 203, 204 and 205 and the through hole 202*a* (FIG. 140. The conductive material 247 in the recesses 202, 203, 204, 205 is then flush with the surface of the substrate 201.

This additive manufacturing method has the substantial advantage that the structure of the desired conductive tracks can be mechanically determined e.g. using laser-ablation, with the introduction of the conductive material transpiring selectively on the substrate base layer. The rate of deposition of the conductive material, e.g. copper can be easily controlled so that a flat surface can be maintained between the introduced conductive material and the base layer or the substrate respectively. Processing of the surface of the conductive material, of the base layer or of the substrate is no longer necessary.

As noted above, the manufacturing methods in accordance with the embodiments described herein facilitate the introduction of conductive tracks (traces) in recesses in a substrate. In this regard, a simple transfer of extremely fine and precise conductive structures for manufacturing inductor coils and related traces for RFID tags is provided. Once the RFID inductor coils and related traces have been manufactured, they may be coupled to logic circuits (e.g., silicon ICs) to form the RFID tags.

Among others, the manufacturing methods described herein have the following additional advantages: high density, high precision of the pattern formation; extremely high resolution; excellent reproducibility with a resolution corresponding to that of the finest of conducting geometries of thin film technology; excellent surface flatness since the conducting leads are engraved into the base material; allows for the use of high temperature resistant base materials (e.g. having $T_g$ values>500 degrees C.); extremely short processing cycle (3 through 6 processing steps per layer), with high potential for cost reduction.

It should be noted that any of the methods described herein could be employed to provide a substrate with an inductor coil on only one side thereof, as opposed to the substrates described above which each show the creation of conductive surfaces to create a coil on either side of the substrate.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only certain embodiments and variants thereof have been shown and described and that all changes and modifications that come within the spirit of the invention are desired to be protected.

What is claimed is:

1. A method of manufacturing an inductor coil for an RFID tag, the inductor coil including a pattern of conductive traces, the method comprising:
   providing an electrically insulating substrate having a predetermined thickness defined by opposed surfaces;
   producing, using laser ablation, recesses in the electrically insulating substrate on at least one of the opposed surfaces, the recesses reaching to a controlled depth which is smaller than the thickness of the electrically insulating substrate, and the recesses forming a pattern on the surface of the electrically insulating substrate corresponding to the pattern of conductive traces of the inductor coil; and depositing conductive material within the recesses, wherein the depositing conductive material within the recesses includes:
depositing conductive material on substantially an entire face of the electrically insulating substrate having the recesses formed therein; and
removing conductive material from the surface of the substrate outside the pattern of conductive traces of the inductor coil.

2. A method of manufacturing an inductor coil for an RFID tag, the inductor coil including a pattern of conductive traces, the method comprising:
providing an electrically insulating substrate having a predetermined thickness defined by opposed surfaces;
producing, using laser ablation, recesses in the electrically insulating substrate on at least one of the opposed surfaces, the recesses reaching to a controlled depth which is smaller than the thickness of the electrically insulating substrate, and the recesses forming a pattern on the surface of the electrically insulating substrate corresponding to the pattern of conductive traces of the inductor coil; and
depositing conductive material within the recesses, wherein the depositing conductive material within the recesses includes:
first, creating an electrically-conductive region within the recesses; and
second, depositing conductive material in the electrically-conductive region.

3. A method of manufacturing an inductor coil for an RFID tag, the inductor coil including a pattern of conductive traces, the method comprising:
providing an electrically insulating substrate having a predetermined thickness defined by opposed surfaces;
producing, using laser ablation, recesses in the electrically insulating substrate on at least one of the opposed surfaces, the recesses reaching to a controlled depth which is smaller than the thickness of the electrically insulating substrate, and the recesses forming a pattern on the surface of the electrically insulating substrate corresponding to the pattern of conductive traces of the inductor coil; and
depositing conductive material within the recesses, wherein the depositing conductive material within the recesses includes:
first, depositing a base layer on substantially an entire face of the electrically insulating substrate and in the recesses formed in the electrically insulating substrate;
second, removing the base layer from the surface of the substrate outside the recesses; and
third, depositing conductive material onto the base layer in the recesses.

4. The method of claim 2, further comprising:
producing through-holes in the electrically insulating substrate over at least some of the recesses, wherein the electrically conductive region is created within the through-holes.

5. The method of claim 3, further comprising:
producing through-holes in the electrically insulating substrate over at least some of the recesses, wherein the base layer is formed in the through-holes, wherein the base layer is removed from the surface of the substrate outside the through-holes, and wherein the conductive material is deposited onto the base layer in the through-holes.

* * * * *